United States Patent
Iwai et al.

(10) Patent No.: US 11,095,376 B1
(45) Date of Patent: Aug. 17, 2021

(54) SYSTEM AND METHOD FOR MEASURING RESIDUAL PHASE NOISE OF A FREQUENCY MIXER

(71) Applicant: Keysight Technologies, Inc., Santa Rosa, CA (US)

(72) Inventors: Junichi Iwai, Kobe (JP); Joel . P Dunsmore, Sebastopol, CA (US); Koji Murata, Kobe (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/106,008

(22) Filed: Nov. 27, 2020

(51) Int. Cl.
*H04B 17/00* (2015.01)
*H04B 17/10* (2015.01)

(52) U.S. Cl.
CPC .................................. *H04B 17/104* (2015.01)

(58) Field of Classification Search
CPC ... H04B 17/0085; H04B 17/104; H04B 17/12
See application file for complete search history.

(56) References Cited

U.S. PATENT DOCUMENTS

| | | |
|---|---|---|
| 10,181,915 B1 | 1/2019 | Slamani et al. |
| 10,432,325 B1 | 10/2019 | Slamani et al. |
| 2008/0247451 A1* | 10/2008 | Yamaguchi ...... G01R 31/31709 375/226 |
| 2013/0197848 A1* | 8/2013 | Sariaslani ............. G01R 29/26 702/111 |
| 2014/0340132 A1* | 11/2014 | Terrovitis ............. H03L 7/0814 327/157 |

OTHER PUBLICATIONS

"VMA Phase Noise Measurements", IPCOM000241458D, The IP.Com Journal, v. 15n5A pp. 204-207, May 2015.
Rohde&Schwarz, "R$S FSWP Phase Noise Analyzer Specifications" , PD 3607.2090.22 Version 09.00 Nov. 2019.

* cited by examiner

*Primary Examiner* — Tuan Pham

(57) ABSTRACT

Residual noise of a frequency mixer is detected. A reference clock is used to generate a first radio frequency (RF) signal, a second RF signal and a third RF signal. The first RF signal and the second RF signal serve as input to the frequency mixer. The reference clock is used to generate a third RF signal. The reference clock is also used to control timing in a detector device. A second frequency mixer mixes an output of the DUT with the third RF signal to produce an input signal for a detector device. Mixing the output of the DUT with the third RF signal cancels at least some of the phase noise within the output signal of the DUT that results from phase noise in the first RF signal and from phase noise in the second RF signal. The detector device detects residual phase noise existing within the input signal for the detector device.

16 Claims, 3 Drawing Sheets

SYSTEM AND METHOD FOR MEASURING RESIDUAL PHASE NOISE OF A FREQUENCY MIXER

BACKGROUND

A frequency converter is used to shift signals from one frequency range to another. A frequency converter that performs frequency conversion of high frequency signals typically includes a frequency mixer, prescalers, multipliers or some combination of these elements.

A frequency mixer, also referred to as a mixer, is a nonlinear circuit that combines two input signals to produce a new output signal. The two input signals are typically combined by summing of the original frequencies of the two input signals to produce a frequency for the new output signal, or by using a difference of the original frequencies of the two input signals as a frequency for the new output signal.

When using a frequency mixer to combine signals, there is invariably some level of phase noise in the new output signal. The phase noise is the frequency-domain representation of random fluctuations in the new output signal.

Test equipment, such as network analyzers, can be used to measure residual phase noise of frequency converters. Residual phase noise measurements cancels the effect of external noise sources, such as power supplies or input clocks. However, the test equipment can also be a source of phase noise which complicates the issue of determining the residual phase noise produced by a device under test.

DETAILED DESCRIPTION

Figure 1:
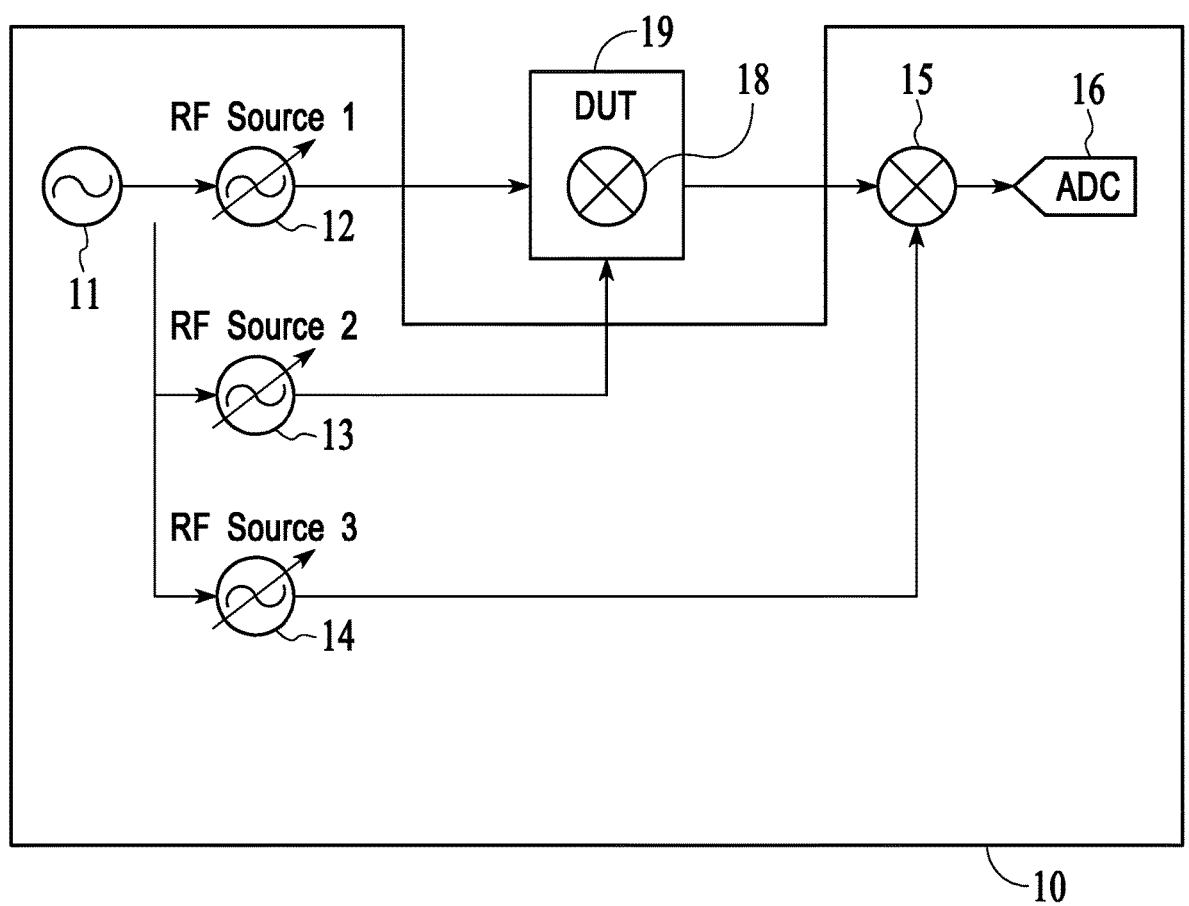
FIG. 1 shows a block diagram of a system used to measure residual phase noise of a frequency mixer.

FIG. 1 shows a test system 10 that includes a radio frequency (RF) signal source 12, an RF signal source 13, an RF signal source 14, a reference signal generator 11, a frequency mixer 16 and an analog to digital converter (ADC) 16.

Reference signal generator 11 produces a clock signal (fref) used to synchronize operation of RF signal source 12, RF signal source 13, RF signal source 14 and ADC 16. RF signal source 12 uses the clock signal from reference signal generator 11 in a direct digital synthesis process (DDS) to generate an RF signal (RF source 1). RF signal source 13 uses the clock signal from reference signal generator 11 in a direct digital synthesis process to generate an RF signal (RF source 2). RF signal source 14 uses the clock signal from reference signal generator 11 in a direct digital synthesis process to generate an RF signal (RF source 3).

Alternatively RF signal source 12 uses the clock signal to generate the RF signal (RF source 1) using a phased locked loop (PLL) or another process. RF signal source 13 uses the clock signal from reference signal generator 11 to generate the RF signal (RF source 2) using a phased locked loop or another process. RF signal source 14 uses the clock signal from reference signal generator 11 to generate the RF signal (RF source 3) using a phased locked loop or another process.

In a direct digital synthesis process (DDS), a time-varying digital form of a signal is first produced, and then a digital-to-analog conversion is performed to produce the RF signal. Direct digital synthesis can improve sensitivity because when direct digital synthesis is used to generate RF signals, the reference phase noise is dominant at a wider offset frequency than is available when phased locked loops or other processes are used to generate RF sources.

ADC 16 uses the clock signal from reference signal generator 11 to generate the digital signal which is analyzed to characterize DUT 19.

A device under test (DUT) 19 includes a frequency mixer 18. Frequency mixer 18 receives the RF signal from RF signal source 12 and the RF signal from RF signal source 13 and produces a frequency mixed signal.

Frequency mixer 16 receives the RF signal from RF signal source 14 and the frequency mixed signal from frequency mixer 18 and produces a frequency mixed signal. ADC 16 receives the frequency mixed signal from frequency mixer 16. ADC 16 produces the digital signal which is analyzed to characterize DUT 19, including determining residual phase noise resulting from frequency mixer 18.

Using the clock signal from reference signal generator 11 as a common reference clock signal for RF signal source 12, RF signal source 13, RF signal source 14 and ADC 16, cancels out phase noise resulting from reference signal generator 11. This is an improvement over test systems where RF signals used for testing are not synchronized using a common reference signal.

When characterizing DUT 19, test system will 10 measure residual phase noise over a range of signal frequencies for signals generated by RF signal source 12, RF signal source 13 and RF signal source 14. For example, in a typical test, RF signal source 12 generates a 10 gigahertz (GHz) signal, RF signal source 12 generates an 11 gigahertz (GHz) and frequency mixer 18 produces output signals at a difference of the two signals received from RF signal source 12 and RF signal source 13 so that the resulting output signal of frequency mixer 18 is a signal of 1 GHz. Frequency mixer 16 produces output signals at a difference of the 1 GHz signal from frequency mixer 18 and the signal from RF signal source 14. The frequency of the signal from RF signal source 14 is selected so that the resulting output signal of frequency mixer 18 is at a frequency sufficiently low to be suitable for input into ADC 16. For example, when mixer 18 produces 1 GHz signal, RF signal source 14 generates a signal of 1 GHz±20 MHz. The resulting signal received by ADC 16 will be 20 MegaHertz (MHz) which is within the operating range of ADC 16.

Figure 2:
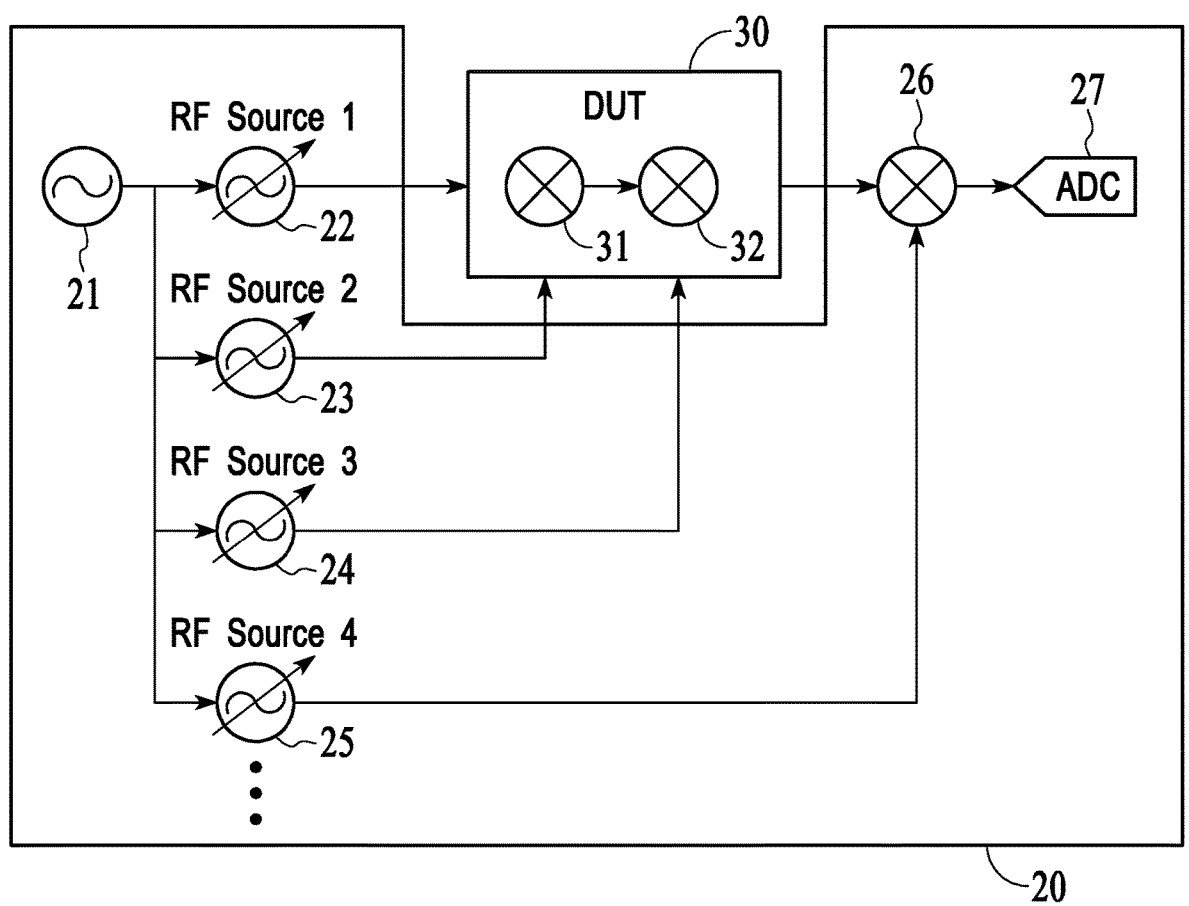
FIG. 2 shows a block diagram of a system used to measure residual phase noise of a multi-stage frequency mixer.

FIG. 2 A test system 20 includes a radio frequency (RF) signal source 22, an RF signal source 23, an RF signal source 24, an RF signal source 25, a reference signal generator 21, a frequency mixer 26 and an analog to digital converter (ADC) 27.

A reference signal generator 21 produces a clock signal (fref) used to synchronize operation of RF signal source 22, RF signal source 23, RF signal source 24, RF signal source 25 and ADC 27. RF signal source 22 uses the clock signal from reference signal generator 21 in a direct digital synthesis process to generate an RF signal (RF source 1). RF signal source 23 uses the clock signal from reference signal generator 21 in a direct digital synthesis process to generate an RF signal (RF source 2). RF signal source 24 uses the clock signal from reference signal generator 21 in a direct digital synthesis process to generate an RF signal (RF source 3). RF signal source 25 uses the clock signal from reference signal generator 21 in a direct digital synthesis process to generate an RF signal (RF source 4). ADC 27 uses the clock signal from reference signal generator 21 to generate the digital signal which is analyzed to characterize DUT 30.

Alternatively, RF signal source 22 uses the clock signal from reference signal generator 21 to generate the RF signal (RF source 1) using a phased locked loop or another process. RF signal source 23 uses the clock signal from reference signal generator 21 to generate the RF signal (RF source 2) using a phased locked loop or another process. RF signal source 24 uses the clock signal from reference signal generator 21 to generate the RF signal (RF source 3) using a phased locked loop or another process. RF signal source 25 uses the clock signal from reference signal generator 21 in a direct digital synthesis process to generate the RF signal (RF source 4) using a phased locked loop or another process.

A DUT 30 includes a frequency mixer 31 and a frequency mixer 32. Frequency mixer 31 receives the RF signal from RF signal source 22 and the RF signal from RF signal source 23 and produces a frequency mixed signal. Frequency mixer 32 receives the RF signal from RF signal source 24 and the frequency mixed signal from frequency mixer 31 and produces a frequency mixed signal.

Frequency mixer 26 receives the RF signal from RF signal source 24 and the frequency mixed signal from frequency mixer 32 and produces a frequency mixed signal. ADC 27 receives the frequency mixed signal from frequency mixer 26. ADC 27 produces the digital signal which is analyzed to characterize DUT 30, including determining residual phase noise resulting from frequency mixer 31 and frequency mixer 32.

Using the clock signal from reference signal generator 21 as a common reference clock signal for RF signal source 22, RF signal source 23, RF signal source 24, RF signal source 25 and ADC 27, cancels out phase noise resulting from reference signal generator 21. This is an improvement over test systems where RF signals used for testing are not synchronized using a common reference signal.

Figure 3:
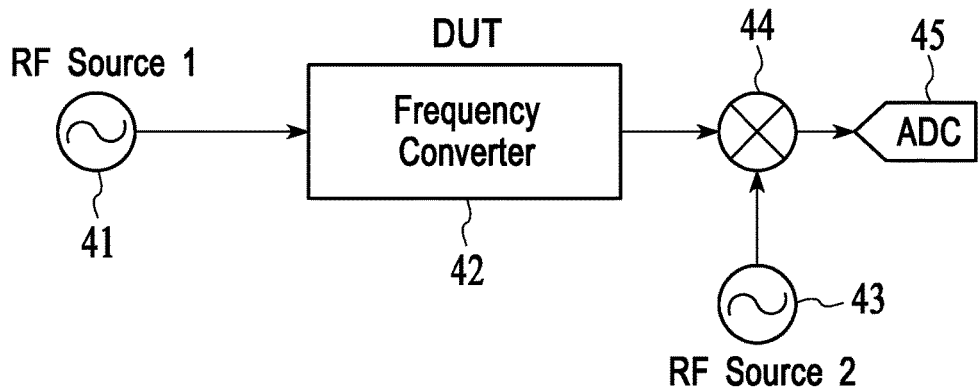
FIG. 3 shows a block diagram of a prior art system used to illustrate calculation of residual phase noise.
Figure 4:
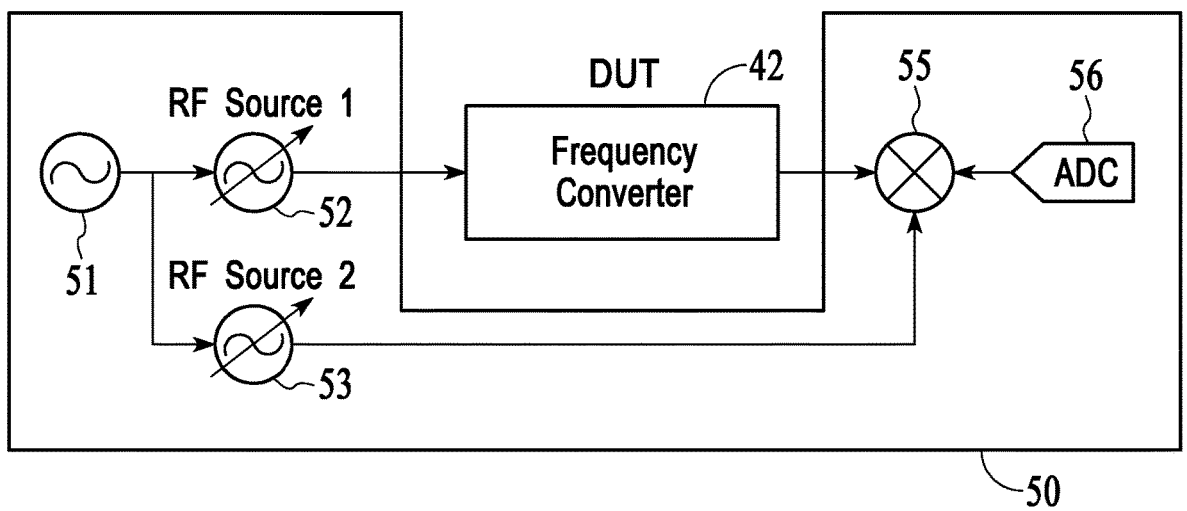
FIG. 4 shows a block diagram of an improved system used to illustrate calculation of residual phase noise.

FIG. 3 and FIG. 4 are used to illustrate the improvement in detection of residual phase noise achieved by using a common clock reference by RF sources.

For example, FIG. 3 shows a prior art test system for testing a DUT 42 that is frequency converter. For example DUT 42 includes a frequency mixer and a local oscillator (LO).

The frequency mixer within DUT 42 receives an RF signal from an RF signal source 41 and an RF signal from the local oscillator within DUT 42, and produces a frequency mixed signal.

A frequency mixer 44 receives a RF signal from an RF signal source 43 and the frequency mixed signal from the frequency mixer within DUT 42 and produces a frequency mixed signal. An ADC 45 receives the frequency mixed signal from frequency mixer 44. ADC 45 produces the digital signal which is analyzed to characterize DUT 42, including determining residual phase noise resulting from the frequency mixer within DUT 42.

When determining the residual phase noise, reducing the phase noise attributed to the other components is essential. The measured phase noise, including component phase noise that cannot be eliminated when calculating residual phase noise, is sometimes referred to as the system phase noise floor. The lower the system phase noise floor, the greater the sensitivity when measuring residual phase noise of DUT 42.

For the test system shown in FIG. 3, the system phase noise floor (or sensitivity) is determined by sum of the absolute phase noise of RF source 41, the absolute phase noise of RF source 43, and residual phase noise of other components. Equation 1 below shows this relationship.

$$\text{System Phase Noise Floor} = \sqrt{(N_{s1})^2 + (N_{s2})^2 + (n\_rcv)^2} \quad \text{Equation 1}$$

In equation 1, $N_{s1}$ represents absolute phase noise of RF source 41, $N_{s2}$ represents absolute phase noise of RF source 43 and n_rcv represents residual phase noise of other components.

Typically, the RF sources are based on reference signals (reference signals+phased locked loop (PLL) synthesizer or reference). This allows $N_{s1}$ and $N_{s2}$ to be described as a sum of phase noise from the reference signal and the other residual phase noise as illustrated by Equation 2 and Equation 3 below.

$$N_{s1} = \sqrt{\left(N_{ref}\frac{f_1}{f_{ref}}\right)^2 + (n\_s1)^2} \quad \text{Equation 2}$$

$$N_{s2} = \sqrt{\left(N_{ref}\frac{f_2}{f_{ref}}\right)^2 + (n\_s2)^2} \quad \text{Equation 3}$$

In Equation 2 and Equation 3, $N_{ref}$ represents absolute phase noise of the reference RF source (which is assumed to be the same value for RF source 41 and RF source 43), $f_{ref}$ represents the frequency of the reference RF source (which is assumed to be the same value for RF source 41 and RF source 43), n_s1 represents the residual phase noise of RF source 41, n_s2 represents the residual phase noise of RF source 42, $f_1$ represents the frequency at the input of DUT 42 and $f_2$ represents the frequency at the output of DUT 42.

Based on the above, the system phase noise of the system shown in FIG. 3 is represented by Equation 4 below.

$$\text{System Phase Noise Floor} = \sqrt{\left(N_{ref}\frac{f_1}{f_{ref}}\right)^2 + \left(N_{ref}\frac{f_2}{f_{ref}}\right)^2 + (n\_s1)^2 + (n\_s2)^2 + (n\_rcv)^2} \quad \text{Equation 4}$$

FIG. 4 shows the improvement provided by using a common reference source. FIG. 4 shows a test system 50 that is used to test DUT 42 that includes the frequency mixer and the local oscillator.

The frequency mixer within DUT 42 receives an RF signal from an RF signal source 52 and an RF signal from the local oscillator within DUT 42, and produces a frequency mixed signal.

A frequency mixer 55 receives a RF signal from an RF signal source 53 and the frequency mixed signal from the frequency mixer within DUT 42 and produces a frequency mixed signal. An ADC 56 receives the frequency mixed signal from frequency mixer 55. ADC 56 produces the digital signal which is analyzed to characterize DUT 42, including determining residual phase noise resulting from the frequency mixer within DUT 42.

A reference signal generator 51 produces a clock signal (fref) used to synchronize operation of RF signal source 52 and RF signal source 53. The presence of reference signal generator 51 means the correlated phase noise of RF source 52 and RF source 53 will be subtracted at mixer output, so the phase noise floor will be improved as below illustrated by Equation 5 below.

$$\text{System Phase Noise Floor} = \sqrt{\left(N_{ref}\frac{|f_2 - f_1|}{f_{ref}}\right)^2 + (\text{n\_s1})^2 + (\text{n\_s2})^2 + (\text{n\_rcv})^2} \quad \text{Equation 5}$$

If the residual phase noise terms (n_s1, n_s2, and n_rcv) are negligible compared with $N_{ref}$ related terms, which is typically the case at lower offset frequencies, the noise floor improvement by the system of FIG. 4 over the system of FIG. 4 is given by Equation 6 below.

$$\text{Noise Floor Improvement} = \frac{|f_2 - f_1|}{\sqrt{(f_1)^2 + (f_2)^2}} \quad \text{Equation 6}$$

For example, if the local oscillator within DUT 42 generates a signal with a frequency of 2 GHz, RF source 1 (i.e., RF source 41 in the system of FIG. 3 and RF source 52 in the system of FIG. 4) generates a signal with a frequency of 8 GHz and RF source 2 (i.e., RF source 43 in the system of FIG. 3 and RF source 53 in the system of FIG. 4) generates a signal with a frequency of 10 GHz, then the system in FIG. 4 provides a phase noise floor that is system provides 0.156 times lower (−16.1 dB) that the noise floor provided by the system in FIG. 3.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. A method for detecting residual noise of a frequency mixer within a device under test (DUT), comprising:
   using a reference clock to generate a first radio frequency (RF) signal;
   using the reference clock to generate a second RF signal;
   using the first RF signal and the second RF signal as input to the frequency mixer;
   using the reference clock to generate a third RF signal;
   using the reference clock to control timing in a detector device;
   using a second frequency mixer to mix an output of the DUT with the third RF signal to produce an input signal for a detector device, wherein mixing the output of the DUT with the third RF signal cancels at least some of the phase noise within the output signal of the DUT that results from phase noise in the first RF signal and from phase noise in the second RF signal; and
   using the detector device to detect residual phase noise existing within the input signal for the detector device.

2. A method as in claim 1 wherein the detector includes an analog to digital converter (ADC).

3. A method as in claim 1 wherein the detector includes a phase detector.

4. A method as in claim 1 additionally comprising:
   using a reference clock to generate a fourth radio frequency (RF) signal; and
   using the fourth RF signal as an additional input to the DUT.

5. A method as in claim 4 wherein the first RF signal, the second RF signal, the third RF signal and the fourth RF signal are each generated using a direct digital synthesis process.

6. A method as in claim 1 wherein the first RF signal, the second RF signal and the third RF signal are each generated using a direct digital synthesis process.

7. A noise detection system, comprising:
   a reference clock;
   a first radio frequency (RF) signal source that uses the reference clock to generate a first RF signal that is used as first input to a device under test (DUT) that includes the frequency mixer;
   a second RF signal source that uses the reference clock to generate a second RF signal that is used as second input to the DUT;
   a third RF signal source that uses the reference clock to generate a third RF signal;
   frequency mixer device that mixes an output of the frequency mixer DUT with the third RF signal to produce a frequency mixed, wherein mixing the output of the frequency mixer DUT with the third RF signal cancels at least some of the phase noise within the output signal of the frequency mixer DUT that results from phase noise in the first RF signal and from phase noise in the second RF signal; and
   a detector device that receives the frequency mixed signal from the frequency mixer device and detects residual phase noise existing within the frequency mixed signal from the frequency mixer device, wherein the reference clock is used to control timing in the detector device.

8. A system as in claim 7, wherein the detector device includes an analog to digital converter (ADC).

9. A system as in claim 7, wherein the detector device includes a phase detector.

10. A system as in claim 7, additionally comprising:
    a fourth RF signal source that uses the reference clock to generate a fourth RF signal that is used as third input to the DUT.

11. A system as in claim 10 wherein the first RF signal, the second RF signal, the third RF signal and the fourth RF signal are each generated using a direct digital synthesis process.

12. A system as in claim 7 wherein the first RF signal, the second RF signal and the third RF signal are each generated using a direct digital synthesis process.

13. A method for detecting residual noise of a frequency mixer within a device under test (DUT), comprising:
    using a reference clock in a direct digital synthesis process to generate a first radio frequency (RF) signal;
    using the first RF signal a first input to the frequency mixer;
    using a local oscillator within the DUT to generate a second RF signal to use as a second input to the frequency mixer;
    using the reference clock in a direct digital synthesis process to generate a third RF signal;
    using the reference clock to control timing in a detector device;
    using a second frequency mixer to mix an output of the DUT with the third RF signal to produce an input signal for a detector device, wherein mixing the output of the DUT with the third RF signal cancels at least some of the phase noise within the output signal of the DUT that results from phase noise in the first RF signal; and using the detector device to detect residual phase noise existing within the input signal for the detector device.

14. A method as in claim 13 wherein the detector includes an analog to digital converter (ADC).

15. A method as in claim 13 wherein the detector includes a phase detector.

16. A method as in claim 13 additionally comprising:
using a reference clock in a direct digital synthesis process to generate a fourth radio frequency (RF) signal; and
using the fourth RF signal as an additional input to the DUT.

\* \* \* \* \*